United States Patent
Hagihara

(10) Patent No.: US 9,609,258 B2
(45) Date of Patent: Mar. 28, 2017

(54) A/D CONVERSION CIRCUIT AND IMAGE-CAPTURING DEVICE

(71) Applicant: OLYMPUS CORPORATION, Tokyo (JP)

(72) Inventor: Yoshio Hagihara, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/883,013

(22) Filed: Oct. 14, 2015

(65) Prior Publication Data

US 2016/0044261 A1 Feb. 11, 2016

Related U.S. Application Data

(63) Continuation of application No. PCT/JP2014/056638, filed on Mar. 13, 2014.

(30) Foreign Application Priority Data

Apr. 18, 2013 (JP) ................................. 2013-087853

(51) Int. Cl.
 *H04N 5/228* (2006.01)
 *H04N 5/378* (2011.01)
 (Continued)

(52) U.S. Cl.
 CPC ............. *H04N 5/378* (2013.01); *H03M 1/12* (2013.01); *H03M 1/123* (2013.01); *H03M 1/56* (2013.01)

(58) Field of Classification Search
 CPC .... H04N 5/378; H04N 5/37455; H04N 5/374; H04N 9/045; H04N 5/3698;
 (Continued)

(56) References Cited

U.S. PATENT DOCUMENTS 8,106,980 B2 * 1/2012 Jeong ................... H04N 5/3765
 348/294
8,169,522 B2 * 5/2012 Orava ................... G01T 1/2928
 348/218.1

(Continued)

FOREIGN PATENT DOCUMENTS

JP 2011-55196 A 3/2011
JP 2011-250009 A 12/2011

OTHER PUBLICATIONS

International Search Report dated Jun. 17, 2014, issued in counterpart application No. PCT/JP2014/056638 (2 pages), w/English translation.

*Primary Examiner* — Trung Diep
(74) *Attorney, Agent, or Firm* — Westerman, Hattori, Daniels & Adrian, LLP

(57) ABSTRACT

An A/D conversion circuit includes: a reference signal generation section that includes an integrator circuit having a first constant current source and generates a reference signal that changes in accordance with a constant current output by the first constant current source; a comparison section that executes a comparison process between an analog signal and the reference signal and terminates the comparison process; a clock generation section that includes a delay section having delay units for delaying an input signal for a predetermined time and outputting delayed input signals in accordance with a constant current output by a second constant current source, and outputs a lower phase signal based on the signals output from the delay units; a latch section that latches the lower phase signal at a timing related to the termination of the comparison process; and a count section that counts a clock based on the lower phase signal.

4 Claims, 10 Drawing Sheets

(51) Int. Cl.
*H03M 1/12* (2006.01)
*H03M 1/56* (2006.01)

(58) Field of Classification Search
CPC .... H04N 5/3745; H04N 5/2253; H04N 5/357;
H04N 5/2254; H04N 5/23232; H04N
5/3765; H01L 27/14643; H01L 27/14689;
H03M 1/56
USPC ............... 348/222.1, 302; 341/126, 155, 156
See application file for complete search history.

(56) References Cited

U.S. PATENT DOCUMENTS

2010/0309356 A1* 12/2010 Ihara .................... H04N 5/3658
348/300
2012/0038343 A1* 2/2012 Takagi .................... G05F 1/561
323/299
2012/0211643 A1* 8/2012 Ikeda .................. H03M 1/0607
250/208.1

* cited by examiner

A/D CONVERSION CIRCUIT AND IMAGE-CAPTURING DEVICE

CROSS REFERENCE TO RELATED APPLICATIONS

This application is a continuation application based on a PCT Patent Application No. PCT/JP2014/056638, filed Mar. 13, 2014, whose priority is claimed on Japanese Patent Application No. 2013-087853, filed Apr. 18, 2013, the entire content of which are hereby incorporated by reference.

BACKGROUND OF THE INVENTION

Field of the Invention

The present invention relates to an analog-to-digital (A/D) conversion circuit and an image-capturing device having the A/D conversion circuit.

Description of the Related Art

A so-called column analog-to-digital converter (ADC)-type solid-state image-capturing device in which column sections provided to correspond to pixel columns arranged in a matrix form in an image-capturing section have an A/D conversion function has been proposed. As an A/D conversion method, there are (1) a successive approximation A/D conversion method, (2) a single slope A/D conversion method, (3) a cyclic A/D conversion method, (4) a $\Delta\Sigma$ A/D conversion method, and the like. A column ADC-type solid-state image-capturing device providing a time-to-digital converter Single Slope (tdcSS)-type ADC circuit, to which an A/D conversion method other than the above is applied, in column sections has been proposed (for example, see Japanese Unexamined Patent Application, First Publication No. 2011-250009). In this proposal, it is disclosed that A/D conversion can be performed on a signal from a pixel at a high signal/noise (S/N) ratio relatively easily using the tdcSS-type ADC circuit.

FIG. 7 shows an example of a configuration of a tdcSS-type ADC circuit pertaining to an existing example. The tdcSS-type ADC circuit shown in FIG. 7 has a clock generation section 1018, a reference signal generation section 1019, a count section 1103, a latch section 1108, and a comparison section 1109.

The reference signal generation section 1019 generates a ramp wave whose voltage value increases or decreases over time. The clock generation section 1018 has a delay section 1021 which has an oscillation circuit configured with a plurality of delay units and outputs a lower phase signal composed of clocks CK[0] to CK[16] output from the plurality of delay units based on a start pulse StartP, and a constant current source 1022 which supplies current for driving a delay section based on a bias voltage Vbias.

The comparison section 1109 has a first input terminal IN1 to which an analog signal Vin that is a target of A/D conversion, a second input terminal IN2 to which the ramp wave from the reference signal generation section 1019 is input, and an output terminal OUT which outputs a comparison result between the analog signal Vin and the ramp wave. The comparison section 1109 compares the analog signal Vin and the ramp wave, and ends the comparison process at a timing at which the ramp wave satisfies a predetermined condition for the analog signal Vin. The latch section 1108 latches the logic state of the lower phase signal from the clock generation section 1018 at a timing at which the comparison process in the comparison section 1109 ends. The count section 1103 performs a count using one of the clocks CK[0] to CK[16] constituting the lower phase signal from the clock generation section 1018 as a count clock, obtaining a count value.

A time in which the comparison section 1109 compares the ramp wave and the analog signal Vin is a time in accordance with a voltage value of the analog signal Vin, and a result of measuring this time is obtained as data of the lower phase signal latched by the latch section 1108 and result data of the count performed by the count section 1103. For example, by binarizing these data, it is possible to obtain digital data that is an A/D conversion result.

Next, the clock generation section 1018 is described. As the clock generation section 1018 of the tdcSS-type ADC circuit, it is preferable to use a ring delay circuit, such as a voltage controlled oscillator (VCO) circuit and the like. FIG. 8 shows an example of a configuration of the clock generation section 1018. The clock generation section 1018 has a delay section 1021 and constant current sources 1022a and 1022b. The constant current sources 1022a and 1022b correspond to the constant current source 1022 of FIG. 7.

The delay section 1021 has an oscillation circuit in which 17 delay units DU[0] to DU[16] are connected in a ring shape. The start pulse StartP is applied to a one-side input terminal of the delay unit DU[0], and the clock CK[16] from the delay unit DU[16] is input to the other-side input terminal. A voltage from a voltage source VDD is input to one-side input terminals of the delay unit DU[1] to the delay unit DU[15], and clocks from delay units of previous stages are input to the other-side input terminals. During an operation time period of the tdcSS-type ADC circuit, the voltage of the voltage source VDD is set to a high level. The clock CK[13] from the delay unit DU[13] is input to the one-side input terminal of the delay unit DU[16], and the clock CK[15] from the delay unit DU[15] of the previous stage is input to the other-side input terminal. The clock CK[13] from the delay unit DU[13] is input to the delay unit DU[16] after three stages as well as the delay unit DU[14] after one stage.

FIG. 9 shows waveforms of the start pulse StartP and output signals (clock CK[0] to CK[16]) of the delay section 1021. The horizontal direction of FIG. 9 represents time, and the vertical direction represents signal voltage. The logic state of the start pulse StartP input to the delay unit DU[0] of the first stage changes from a low (L) state to a high (H) state, so that the delay units DU[0] to DU[16] start a transition operation. At a timing at which a delay time $t_{dly}$[sec] of the delay unit DU[0] elapses after the logic state of the start pulse StartP is changed, the logic state of the clock CK[0] output from the delay unit DU[0] is changed from the H state to the L state. Subsequently, at a timing at which the delay time $t_{dly}$[sec] of the delay unit DU[1] elapses after the logic state of the clock CK[0] is changed, the logic state of the clock CK[1] output from the delay unit DU[1] is changed from the L state to the H state. After that, the logic states of clocks output from respective delay units are changed in sequence in the same way.

The constant current sources 1022a and 1022b cause a constant current for driving the delay units DU[0] to DU[16] to flow. The current values of the constant current sources 1022a and 1022b are n times the current value of a unit current source that is, n×I [A] (n: a coefficient greater than 0, I: the current value of a unit current source). The current value of the unit current source is controlled by the bias voltage Vbias.

The delay section 1021 operates at a predetermined frequency which is in accordance with the delay time $t_{dly}$[sec] of the delay units DU[*] (*: 0 to 16). The delay time $t_{dly}$[sec] of the delay units DU[*] (*: 0 to 16) is changed in accordance with the current value n×I [A] flowing through the delay units DU[*] (*: 0 to 16). Specifically an operating frequency freq. [Hz] of the delay section 1021 is changed in accordance with the current value n×I [A] of the constant current sources 1022a and 1022b. The operating frequency freq, [Hz] is controlled to increase in approximate proportion to an increase in the current value when the current value increases within a predetermined current value range, and to decrease in approximate proportion to a decrease in the current value when the current value decreases. In other words, within the predetermined current value range, it is possible to obtain a relationship in which the current value n×I [A] and the operating frequency freq. [Hz] are approximately proportional to each other.

Equation (1) represents the operating frequency freq. [Hz] of the delay section 1021. Here, N is the number of delay units constituting the delay section 1021, $t_{dly}$ is the delay time of the delay units, k is a coefficient, $C_L$ is a load capacity, and Vdd is a power supply voltage.

$$\text{freq.} = \frac{1}{N \times t_{dly}} \quad (1)$$
$$= k \times \frac{n \times I}{N \times C_L \times Vdd} [Hz]$$

FIG. 10 shows a relationship between the current value n×I [A] and the operating frequency freq. [Hz] in accordance with Equation (1). The horizontal direction of FIG. 10 represents the current value n×I [A], and the vertical direction represents the operating frequency freq. [Hz]. In a predetermined current range, the operating frequency freq. [Hz] is approximately proportional to the current value n×I [A].

SUMMARY OF THE INVENTION

According to a first aspect of the present invention, an analog-to-digital (A/D) conversion circuit includes: a reference signal generation section which has an integrator circuit having at least a capacitor and a first constant current source, and generates a reference signal changed in accordance with a constant current output by the first constant current source; a comparison section which performs a comparison process between an analog signal that is a target of A/D conversion and the reference signal and ends the comparison process at a timing at which the reference signal satisfies a predetermined condition for the analog signal; a clock generation section which has a delay section having a plurality of delay units delaying an input signal for a predetermined time and outputting delayed input signals in accordance with a constant current output by a second constant current source, and outputs a lower phase signal based on the signals output from the plurality of delay units; a latch section which latches the lower phase signal at a timing related to the end of the comparison process; and a count section which counts a clock based on the lower phase signal as a count clock. When m and n are positive real numbers, the first constant current source outputs the current m times a unit current output by a unit current source in accordance with a bias voltage, and the second constant current source outputs the current n times the unit current and outputs digital data corresponding to the analog signal based on the lower phase signal latched by the latch section and a count result of the count section.

According to a second aspect of the present invention, in the A/D conversion circuit related to the first aspect, the unit current source may have a transistor having a gate to which the bias voltage is applied.

According to a third aspect of the present invention, an image-capturing device includes: an image-capturing section which has a photoelectric conversion element and in which a plurality of pixels outputting pixel signals are arranged in a matrix form; and the A/D conversion circuit which is related to the first aspect or the second aspect and to which analog signals in accordance with the pixel signals are input.

DETAILED DESCRIPTION OF THE INVENTION

Hereinafter, with reference to the drawings, embodiments of the present invention will be described.

First Embodiment

Figure 1:
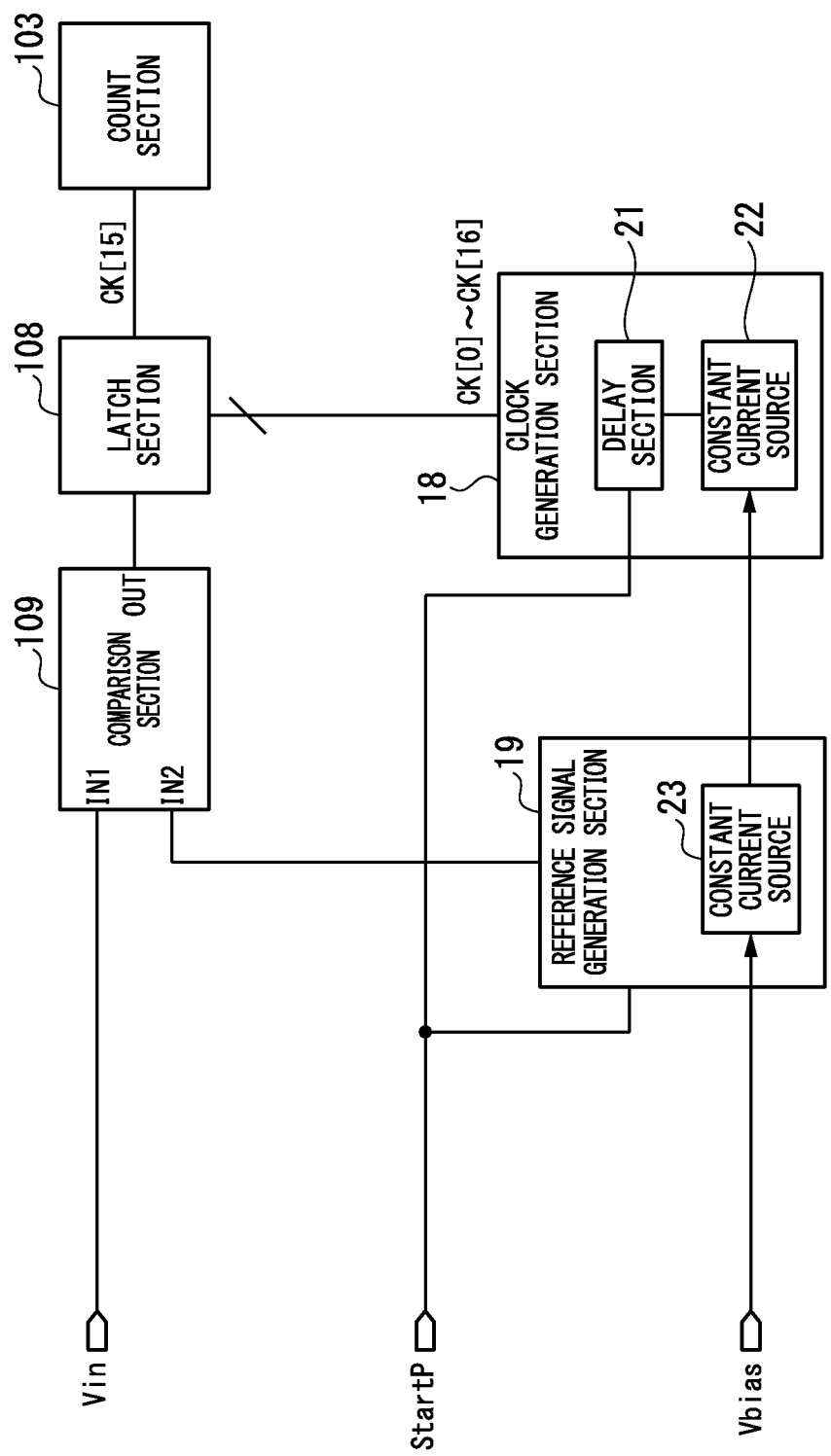
FIG. 1 is a block diagram showing a configuration of an analog-to-digital (A/D) conversion circuit pertaining to a first embodiment of the present invention.

First, a first embodiment of the present invention is described. FIG. 1 shows an example of a configuration of an analog-to-digital (A/D) conversion circuit pertaining to this embodiment. An A/D conversion circuit shown in FIG. 1 has a clock generation section 18, a reference signal generation section 19, a count section 103, a latch section 108, and a comparison section 109.

Figure 8:
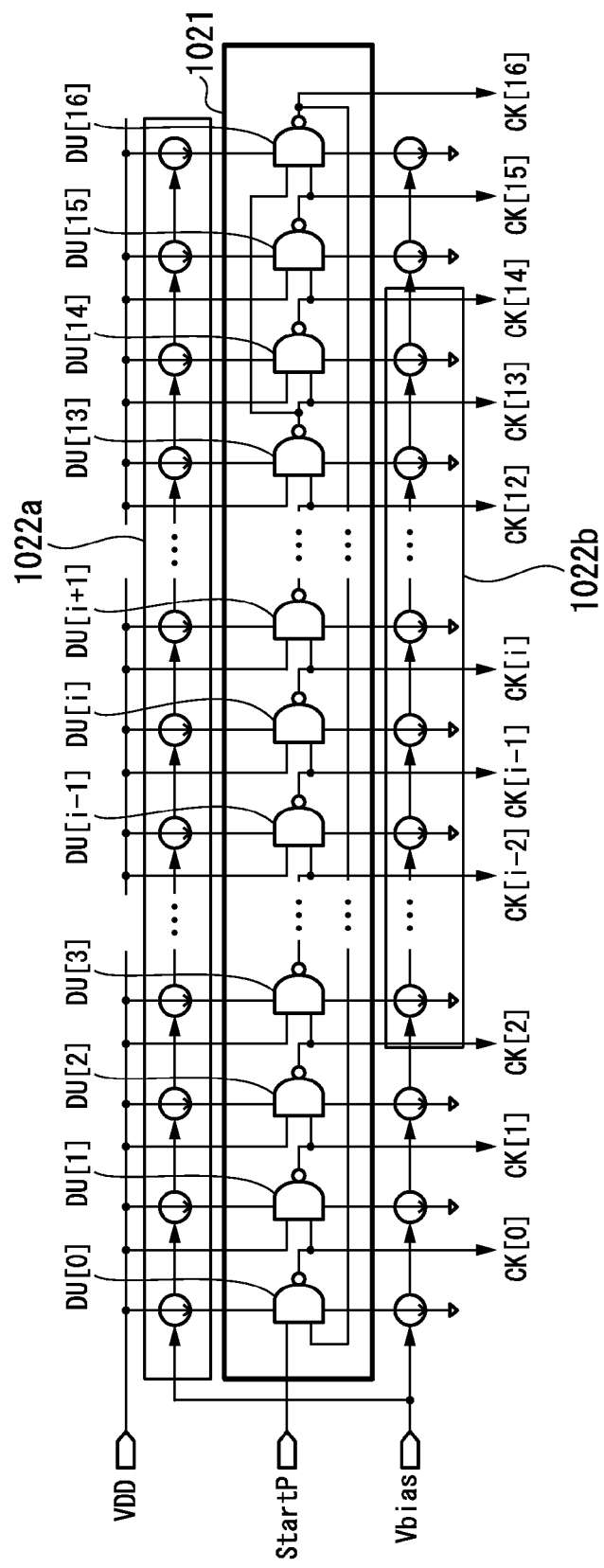
FIG. 8 is a circuit diagram showing an example of a configuration of a clock generation section.
Figure 9:
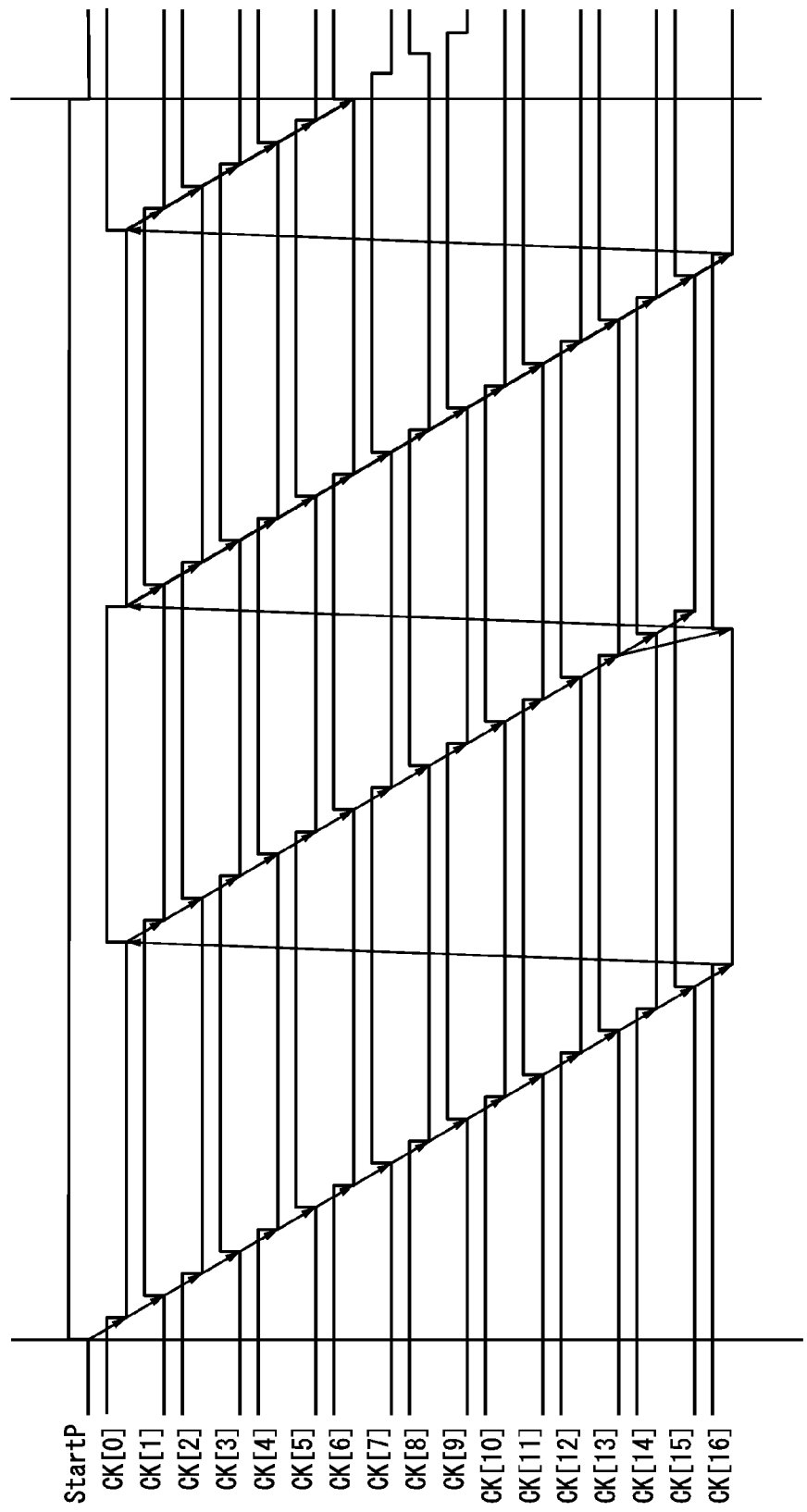
FIG. 9 is a timing chart representing the operation of a delay section.
Figure 10:
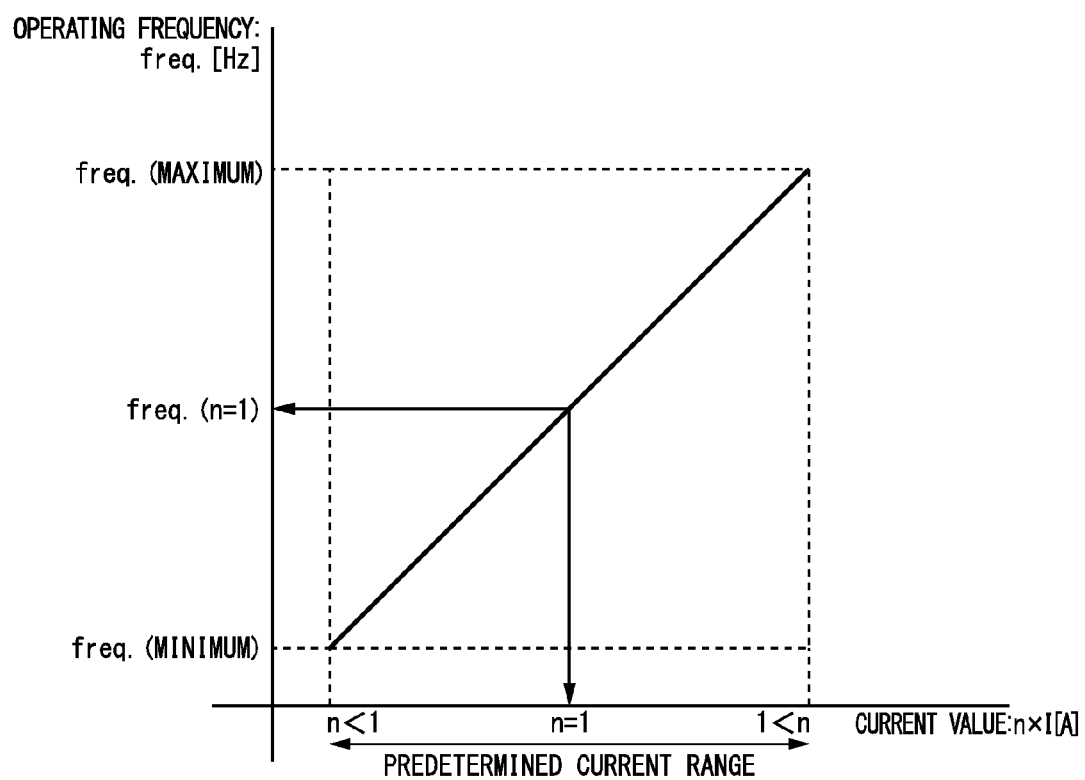
FIG. 10 is a graph showing a relationship of the operating frequency of the delay section.
Figure 11:
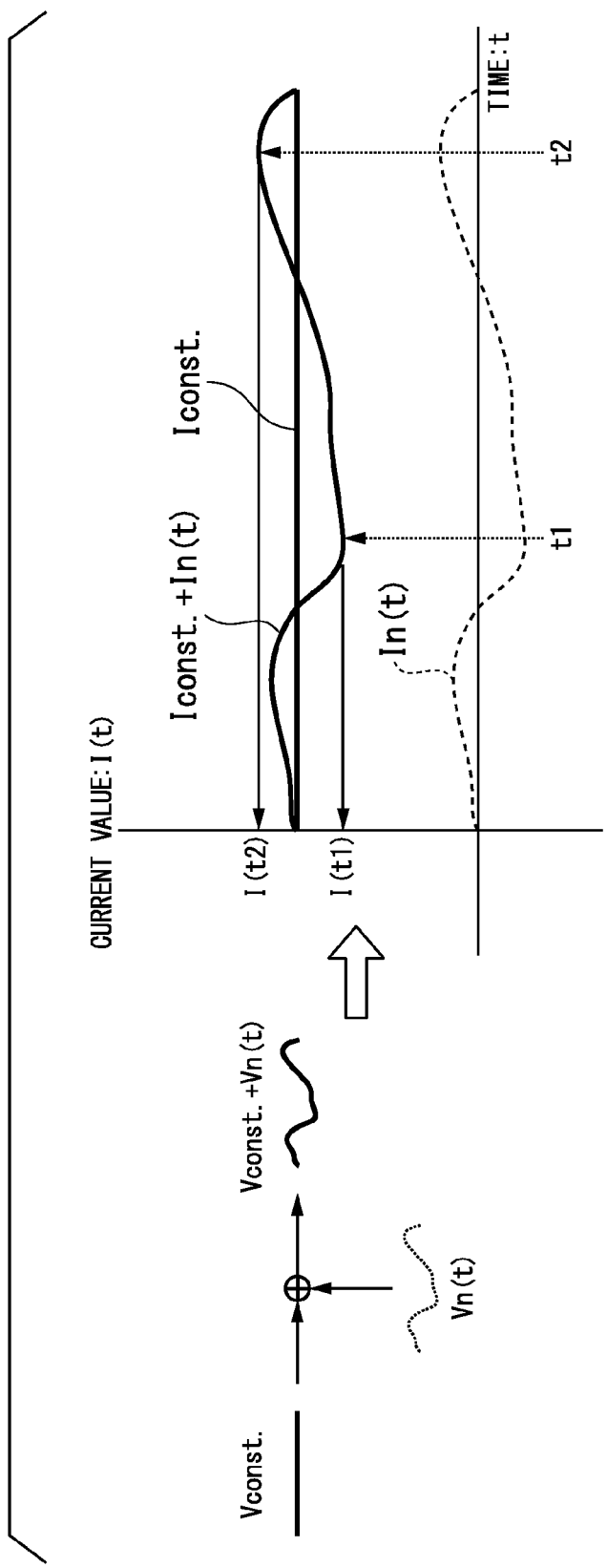
FIG. 11 is a graph showing a change of the current value of a unit current source over time.

The reference signal generation section 19 has an integrator circuit having a constant current source (first constant current source) 23, and generates a ramp wave which is a reference signal whose voltage value increases or decreases over time in accordance with a constant current output by the constant current source 23. The clock generation section 18 has a delay section 21 which has an oscillation circuit configured with a plurality of delay units and outputs a lower phase signal composed of clocks CK[0] to CK[16] output from the plurality of delay units based on a start pulse StartP, and a constant current source (second constant current source) 22 which supplies current for driving the delay units based on a bias voltage. A configuration of the delay section 21 is, for example, the same as a configuration of the delay section 1021 shown in FIG. 8. The constant current source 22 corresponds to the constant current sources 1022a and 1022b of FIG. 8. A bias voltage for controlling the constant current source 23 of the reference signal generation section 19 and the bias voltage for controlling the constant current source 22 of the clock generation section 18 are a common bias voltage Vbias.

The comparison section 109 has a first input terminal IN1 to which an analog signal Vin which is a target of A/D conversion is input, a second input terminal IN2 to which the ramp wave from the reference signal generation section 19 is input, and an output terminal OUT which outputs a comparison result between the analog signal Vin and the ramp wave. The comparison section 109 compares the analog signal Vin and the ramp wave, and ends the comparison process at a timing at which the ramp wave satisfies a predetermined condition for the analog signal Vin. The latch section 108 latches the logic state (a high (H) state (corresponding to 1) or a low (L) state (corresponding to 0)) of the lower phase signal from the clock generation section 18 at a timing at which the comparison process in the comparison section 109 ends. The count section 103 performs a count using one of the clocks CK[0] to CK[16] constituting the lower phase signal from the clock generation section 18 as a count clock, obtaining a count value.

A time in which the comparison section 109 makes a comparison between the ramp wave and the analog signal Vin is a time in accordance with the voltage value of the analog signal Vin, and a result of measuring this time is obtained as data of the lower phase signal latched by the latch section 108 and result data of the count performed by the count section 103. For example, by binarizing these data, it is possible to obtain digital data that is an A/D conversion result.

Figure 2:
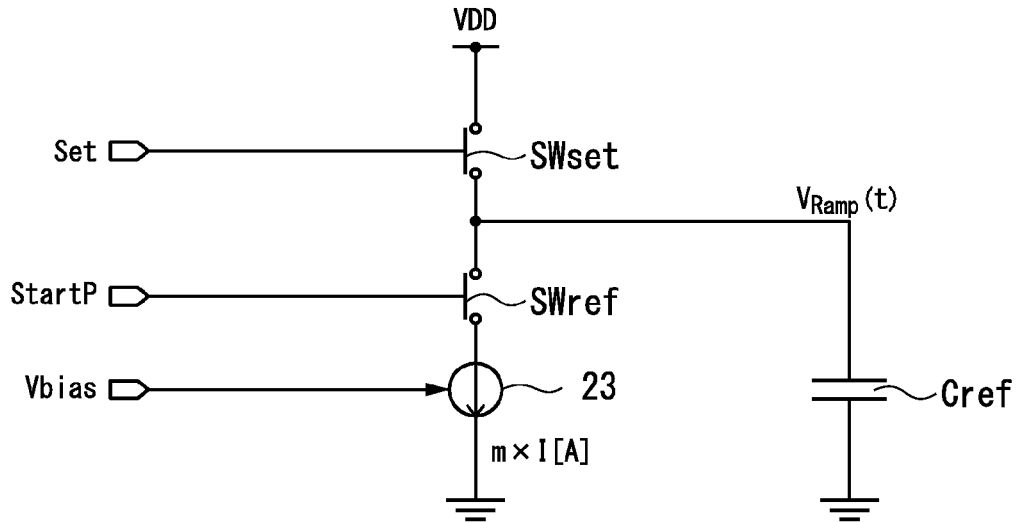
FIG. 2 is a circuit diagram showing a configuration of an integrator circuit pertaining to the first embodiment of the present invention.

FIG. 2 shows an example of a configuration of an integrator circuit of the reference signal generation section 19. The integrator circuit includes a capacitor Cref, switch elements SWset and SWref and the constant current source 23. The switch element SWset is a switch for changing the connection between the capacitor Cref and a voltage source VDD (a voltage value: Vdd). the switch element SWref is a switch for changing the connection between the capacitor Cref and the constant current source 23.

One end of the switch element SWset is connected to the voltage source VDD. One end of the switch element SWref is connected to the other end of the switch element SWset. One end of the constant current source 23 is connected to the other end of the switch element SWref, and the other end of the constant current source 23 is connected to a ground. One end of the capacitor Cref is connected to the other end of the switch element SWset, and the other end of the capacitor Cref is connected to a ground. The on and off of the switch element SWset are controlled by a control signal Set, and the on and off of the switch element SWref are controlled by the start pulse StartP. The voltage of the one end of the capacitor Cref is output as the ramp wave.

The current value of the current output by the constant current source 23 is m times the current value (unit current) of a unit current source, that is, m×I [A] (m: a coefficient larger than 0, I: the current value of the unit current source). The current value of the unit current source is controlled by the bias voltage Vbias.

Figure 3:
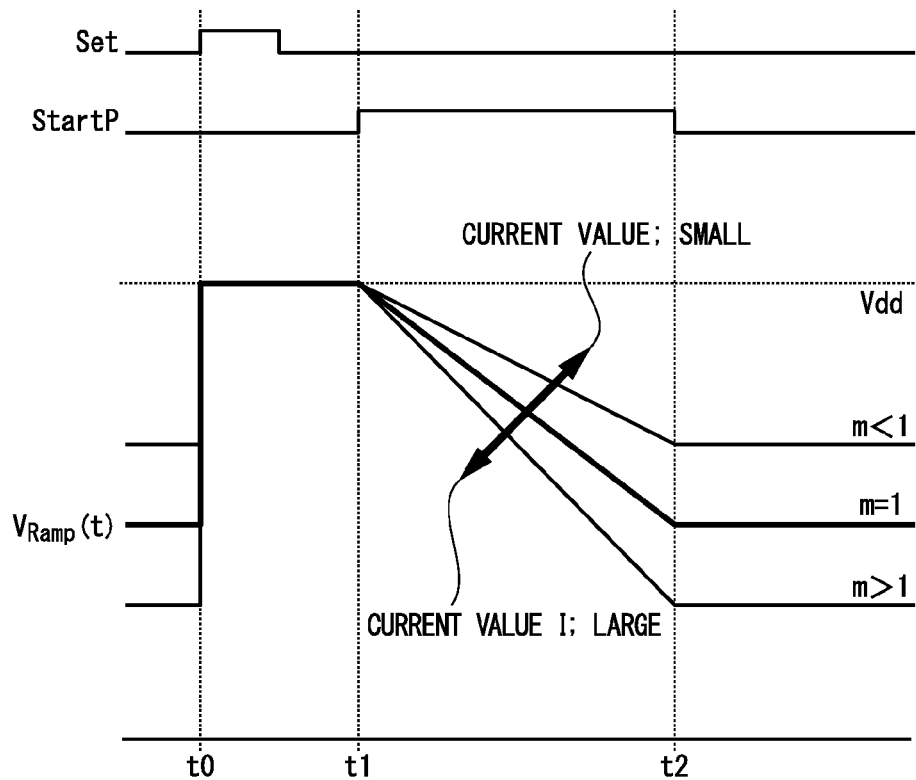
FIG. 3 is a timing chart representing the operation of the integrator circuit pertaining to the first embodiment of the present invention.

Next, the operation of the integrator circuit is described. FIG. 3 represents the operation of the integrator circuit. The horizontal direction of FIG. 3 represents time, and the vertical direction represents a voltage value. In FIG. 3, waveforms of the control signal Set, the start pulse StartP, and a voltage $V_{Ramp}(t)$ of the ramp wave are shown.

First, the control signal Set is changed from an L level to an H level so that the switch element SWset attains an ON state, and the one end of the capacitor Cref is connected to the voltage source VDD (time t0). Due to this, the voltage $V_{Ramp}(t)$ of the ramp wave is reset to the voltage value Vdd ($V_{Ramp}(t)$=Vdd). Subsequently, the control signal Set is changed from the H level to the L level, so that the switch element SWset attains an OFF state, and then the start pulse StartP is changed from the L level to the H level. The switch element SWref thereby attains the ON state, and the one end of the capacitor Cref is connected to the constant current source 23 (time t1). Due to this, a current in accordance with the current value m×I [A] of the current output by the constant current source 23 flows. When noise overlaps the bias voltage Vbias, the current value m×I [A] is changed in accordance with a change of the bias voltage Vbias.

The voltage $V_{Ramp}(t)$ of the ramp wave at an arbitrary time t between a point in time (time t1) at which the switch element SWref attains the ON state and a point in time (time t2) at which the switch element SWref attains the OFF state becomes Equation (2) below. In Equation (2), C is the capacitance value of the capacitor Cref.

$$V_{ramp}(t) = Vdd - \frac{m \times I}{C} \times (t - t1) \qquad (2)$$

As shown in Equation (2), it is possible to obtain the ramp wave which is changed with a constant slope. The slope of the ramp wave becomes larger as the coefficient m becomes larger, and the slope of the ramp wave becomes smaller as the coefficient m becomes smaller. The operating frequency of the clock generation section 18 becomes Equation (1) described above, and the voltage of the ramp wave generated by the reference signal generation section 19 becomes Equation (2). Since the term of the current value I of the unit current source is present in a numerator of Equation (1) and the numerator of a second term of Equation (2), it becomes possible to approximately synchronize a change of the ramp wave of the reference signal generation section 19 and the operation of the delay section 21.

Figure 4:
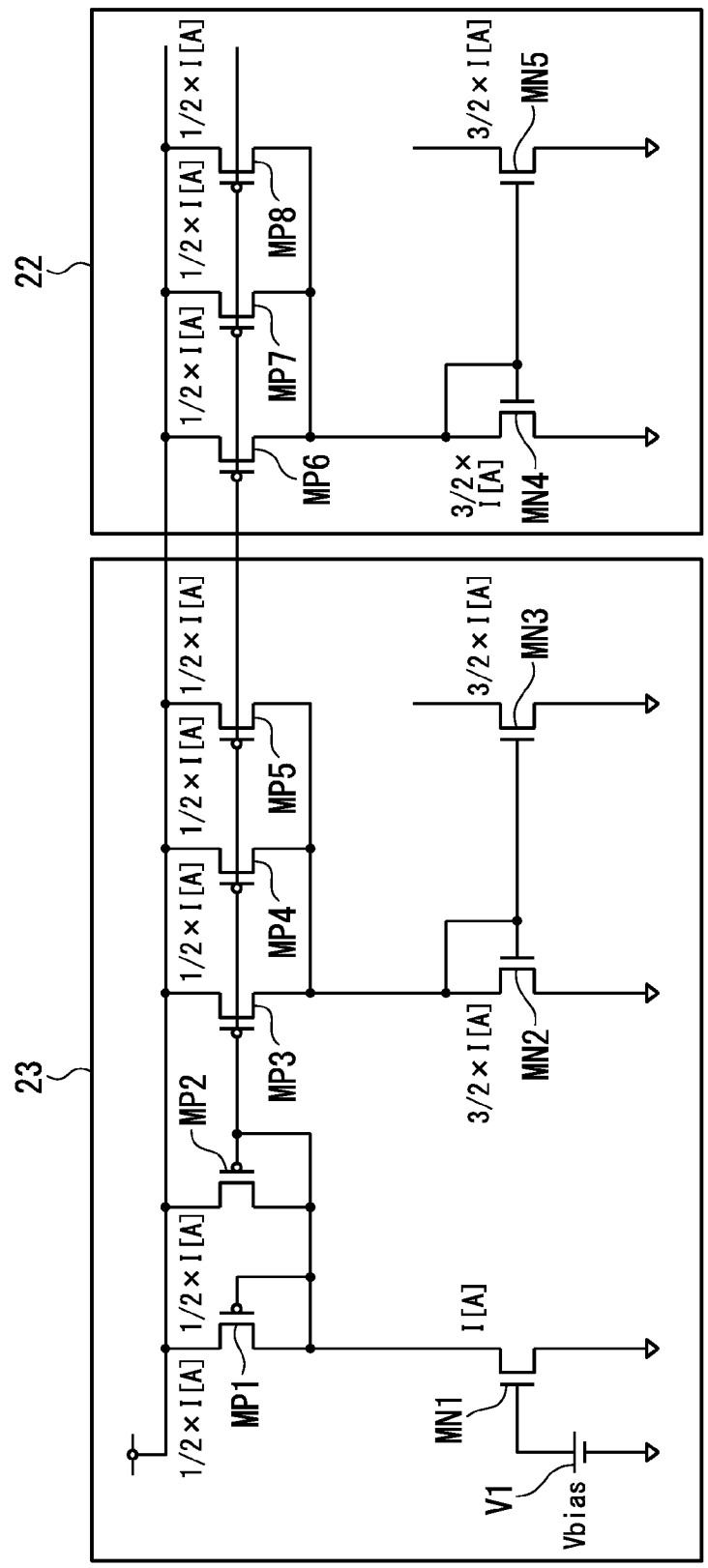
FIG. 4 is a circuit diagram showing configurations of constant current sources pertaining to the first embodiment of the present invention.

FIG. 4 shows an example of configurations of the constant current sources 22 and 23. The constant current source 23 has transistors MP1, MP2, MP3, MP4, and MP5 which are identical p-channel metal oxide semiconductor (PMOS) transistors, transistors MN1, MN2, and MN3 which are identical n-channel metal oxide semiconductor (NMOS) transistors, and a voltage source V1 which outputs the bias voltage Vbias (a first bias voltage). The constant current source 22 has transistors MP6, MP7, and MP8 which are identical PMOS transistors, and transistors MN4 and MN5 which are identical NMOS transistors.

The bias voltage Vbias is input to the gate terminal of the transistor MN1. The transistor MN1 constitutes the unit current source, and outputs a current (a current value: I [A]) in accordance with the bias voltage Vbias input to the gate terminal. The transistor MN1 is supplied with currents from the transistors MP1 and MP2 connected in parallel. The transistors MP1 and MP2 supply the same currents (a current value: ½×I [A]). Since the gate terminal of the transistor MP2 is connected to the gate terminals of the transistors MP3, MP4, and MP5, voltages of the gate terminals of the transistors MP2, MP3, MP4, and MP5 are the same. Due to this, the transistor MP2 and the transistors MP3, MP4, and MP5 form a current mirror, and the same current (a current value: ½×I [A]) flows to the transistors MP2, MP3, MP4, and MP5.

Also, the gate terminal of the transistor MP2 is connected to the gate terminal of the transistor MP1 and the drain terminal of the transistor MN1. For this reason, a bias voltage (a second bias voltage) of the transistors MP1 and MP2 becomes the sum of the bias voltage Vbias input to the gate terminal of the transistor MN1 and a gate-drain voltage of the transistor MN1, that is, a voltage synchronized with the bias voltage Vbias. Therefore, the current synchronized with the bias voltage Vbias flows to the transistors MP2, MP3, MP4, and MP5.

The drain terminals of the transistors MP3, MP4, and MP5 are connected to the drain terminal of the transistor MN2. A current (a current value: 3/2×I [A]) obtained by adding up the currents supplied from the transistors MP3, MP4, and MP5 flows to the transistor MN2. The transistors MN2 and MN3 form a current mirror, and the same current as the current flowing to the transistor MN2 flows to the transistor MN3. Also, the current flowing to the transistor MN3 is synchronized with the current output by the transistor MN1 constituting the unit current source. The current flowing to the transistor MN3 is the current (the current value: m×I [A]) flowing to the constant current source 23 of FIG. 2. In this example, m=3/2. Accordingly, the ramp wave generated by the reference signal generation section 19 is synchronized with the bias voltage Vbias.

Also, since the gate terminal of the transistor MP2 is connected to the gate terminals of the transistors MP6, MP7, and MP8, voltages of the gate terminals of the transistors MP2, MP6, MP7, and MP8 are the same. Due to this, the transistor MP2 and the transistors MP6, MP7, and MP8 form a current mirror, and the same current (a current value: ½×I [A]) flows to the transistors MP2, MP6, MP7, and MP8.

As described above, the bias voltage of the transistors MP1 and MP2 is the sum of the bias voltage Vbias input to the gate terminal of the transistor MN1 and the gate-drain voltage of the transistor MN1, that is, a voltage synchronized with the bias voltage Vbias. Therefore, the current synchronized with the bias voltage Vbias flows to the transistors MP1, MP2, MP6, MP7, and MP8.

The drain terminals of the transistors MP6, MP7, and MP8 are connected to the drain terminal of the transistor MN4. A current (a current value: 3/2×I [A]) obtained by adding up currents supplied from the transistors MP6, MP7, and MP8 flows to the transistor MN4. The transistors MN4 and MN5 form a current mirror, and the same current as the current flowing to the transistor MN4 flows to the transistor MN5. Also, the current flowing to the transistor MN5 is synchronized with the current output by the transistor MN1 constituting the unit current source. The current flowing to the transistor MN5 is the current flowing to the delay units of the delay section 21. Accordingly, the operation of the delay units is synchronized with the bias voltage Vbias.

As mentioned above, when the respective PMOS transistors are the same and the respective NMOS transistors are the same, a current sink-type current source which generates a current value 3/2 times the current value flowing to the mil current source is configured. Also, a current source can be configured to be the same as a current sink. By changing the number or size of transistors forming a current mirror, it is possible to obtain a current having a current value of m×I [A] with respect to an arbitrary m (however, m>0) in each of the constant current sources 22 and 23.

In this example, current values obtained in the constant current sources 22 and 23 are the same, but the constant current sources 22 and 23 may be configured so that a current value obtained in the constant current source 22 and a current value obtained in the constant current source 23 are different. Also, in this example, the voltage source V1 and the transistors MP1, MP2, and MN1 are in the constant current source 23. However, these may be in the constant current source 22, or may be somewhere other than the constant current sources 22 and 23.

As described above, according to this embodiment, the constant current source 23 in the reference signal generation section 19 and the constant current source 22 in the clock generation section 18 output a current (a current synchronized with a current output by a unit current source) in accordance with a bias voltage (a bias voltage of the transistor MP2) synchronized with the bias voltage Vbias, and thus it is possible to synchronize a change of a ramp wave and the operation of the delay section 21. For this reason, even when noise of a relatively low frequency such as l/f noise, overlaps the bias voltage Vbias, it is possible to suppress unevenness in A/D conversion results. Also, it is possible to suppress an increase in a chip area without using a synchronization circuit such as a phase-locked loop (PLL) circuit or the like.

In addition, by configuring a unit current source with a transistor (the transistor MN1) having a gate to which the bias voltage Vbias is applied, it is possible to easily configure the unit current source.

Figure 5:
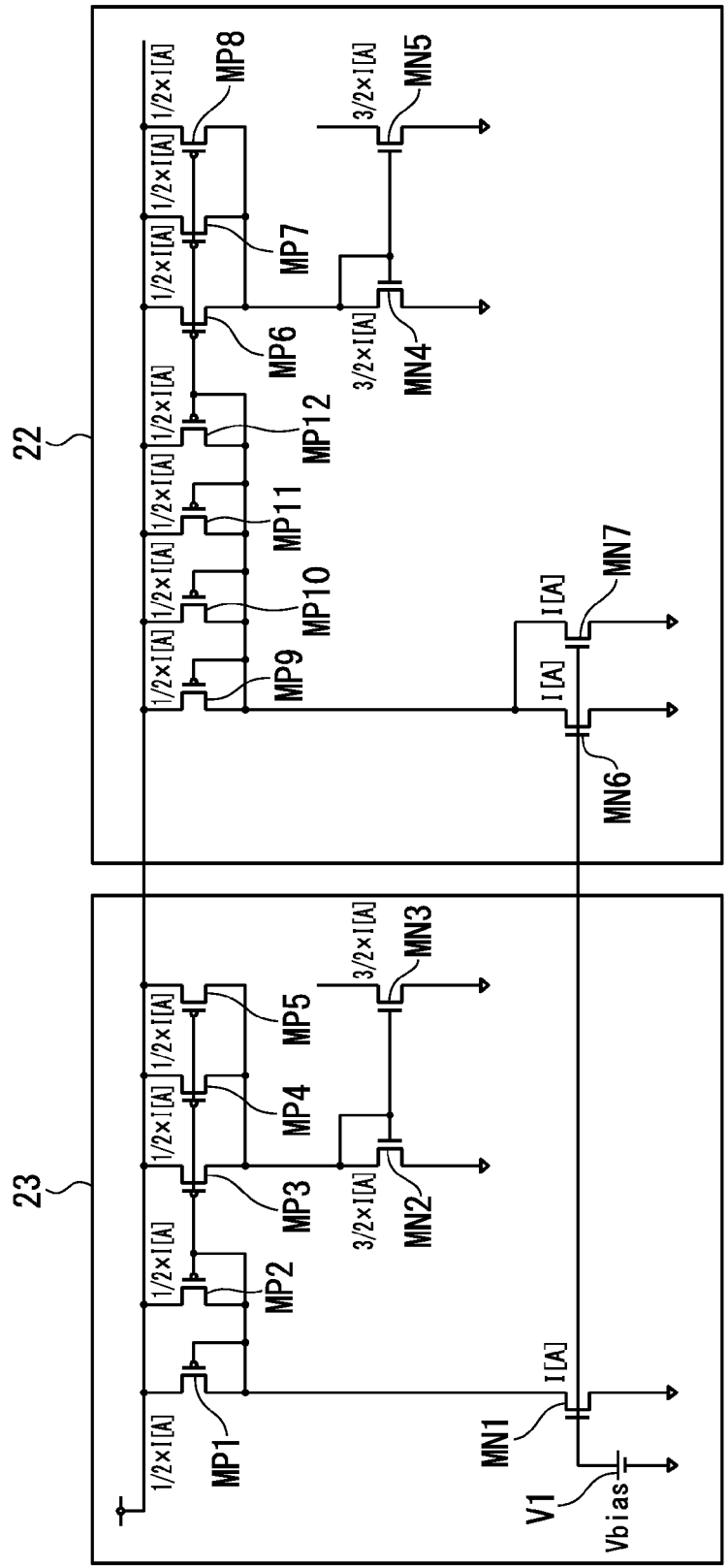
FIG. 5 is a circuit diagram showing configurations of constant current sources pertaining to the first embodiment of the present invention.

Further, FIG. 5 shows another example of a configuration of the constant current sources 22 and 23. Since a configuration of the constant current source 23 is approximately the same as the configuration of FIG. 4, description of a configuration of the constant current source 23 will be omitted. The constant current source 22 has transistors MP6, MP7, MP8, MP9, MP10, MP11, and MP12 which are identical PMOS transistors and transistors MN4, MN5, MN6, and MN7 which are identical NMOS transistors.

The bias voltage Vbias is input to the gate terminals of the transistors MN6 and MN7. The transistors MN6 and MN7 constitute a unit current source, and output currents (current values: I [A]) in accordance with the bias voltage Vbias input to the gate terminals. The transistors MN6 and MN7 are supplied with currents from the transistors MP9, MP10, MP11, and MP12 connected in parallel. The transistors MP9, MP10, MP11, and MP12 supply the same current (a current, value: ½×I [A]). Since the gate terminal of the transistor MP12 is connected to the gate terminals of the transistors MP6, MP7, and MP8, voltages of the gate terminals of the transistors MP6, MP7, MP8, MP9, MP10, MP11, and MP12 are the same. Due to this, the transistor MP12 and the transistors MP6, MP7, and MP8 form a current mirror, and the same current (a current value: ½×I [A]) flows to the transistors MP6, MP7, MP8, MP9, MP10, MP11 and MP12.

The gate terminal of the transistor MP12 is connected to the gate terminals of the transistors MP9, MP10, and MP11 and the drain terminal of the transistor MN6. For this reason, a bias voltage (a third bias voltage) of the transistors MP9, MP10, MP11, and MP12 is the sum of the bias voltage Vbias input to the gate terminals of the transistors MN6 and MN7 and die gate-drain voltage of the transistor MN1, that is, a voltage synchronized with the bias voltage Vbias. Therefore, the current synchronized with the bias voltage Vbias flows to the transistors MP6, MP7, MP8, MP9, MP10, MP11, and MP12.

The drain terminals of the transistors MP6, MP7, and MP8 are connected to the drain terminal of the transistor MN4. A current (a current value: 3/2×I [A]) obtained by adding up currents supplied from the transistors MP6, MP7, and MP8 flows to the transistor MN4. The transistors MN4 and MN5 form a current mirror, and the same current as the current flowing to the transistor MN4 flows to the transistor MN5. Also, the current flowing to the transistor MN5 is synchronized with the current output by the transistors MN6 and MN7 constituting the unit current source. The current flowing to the transistor MN5 is the current flowing to the delay units of the delay section 21. Accordingly, the operation of the delay units is synchronized with the bias voltage Vbias.

Second Embodiment

Figure 6:
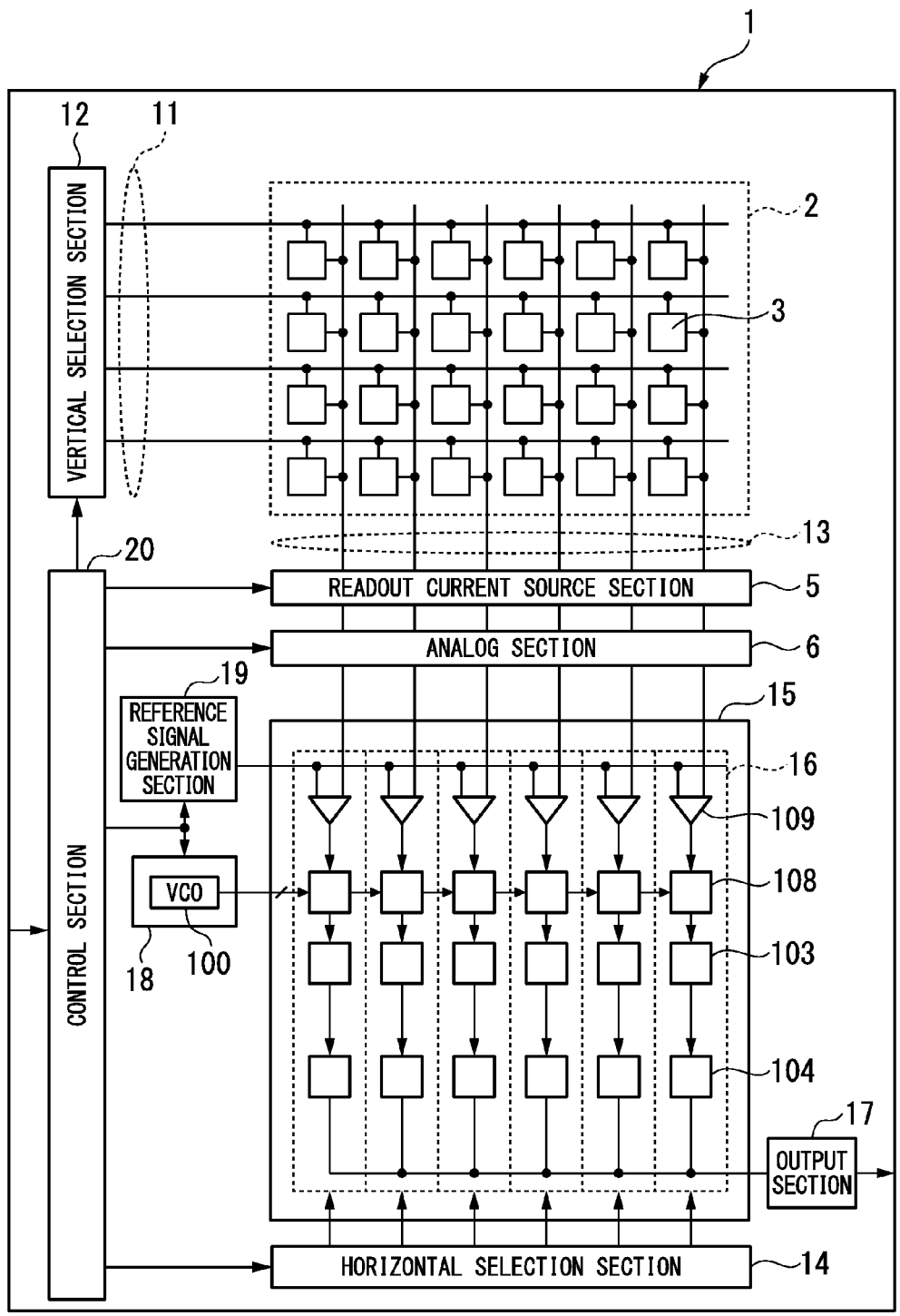
FIG. 6 is a block diagram showing a configuration of an image-capturing device pertaining to a second embodiment of the present invention.
Figure 7:
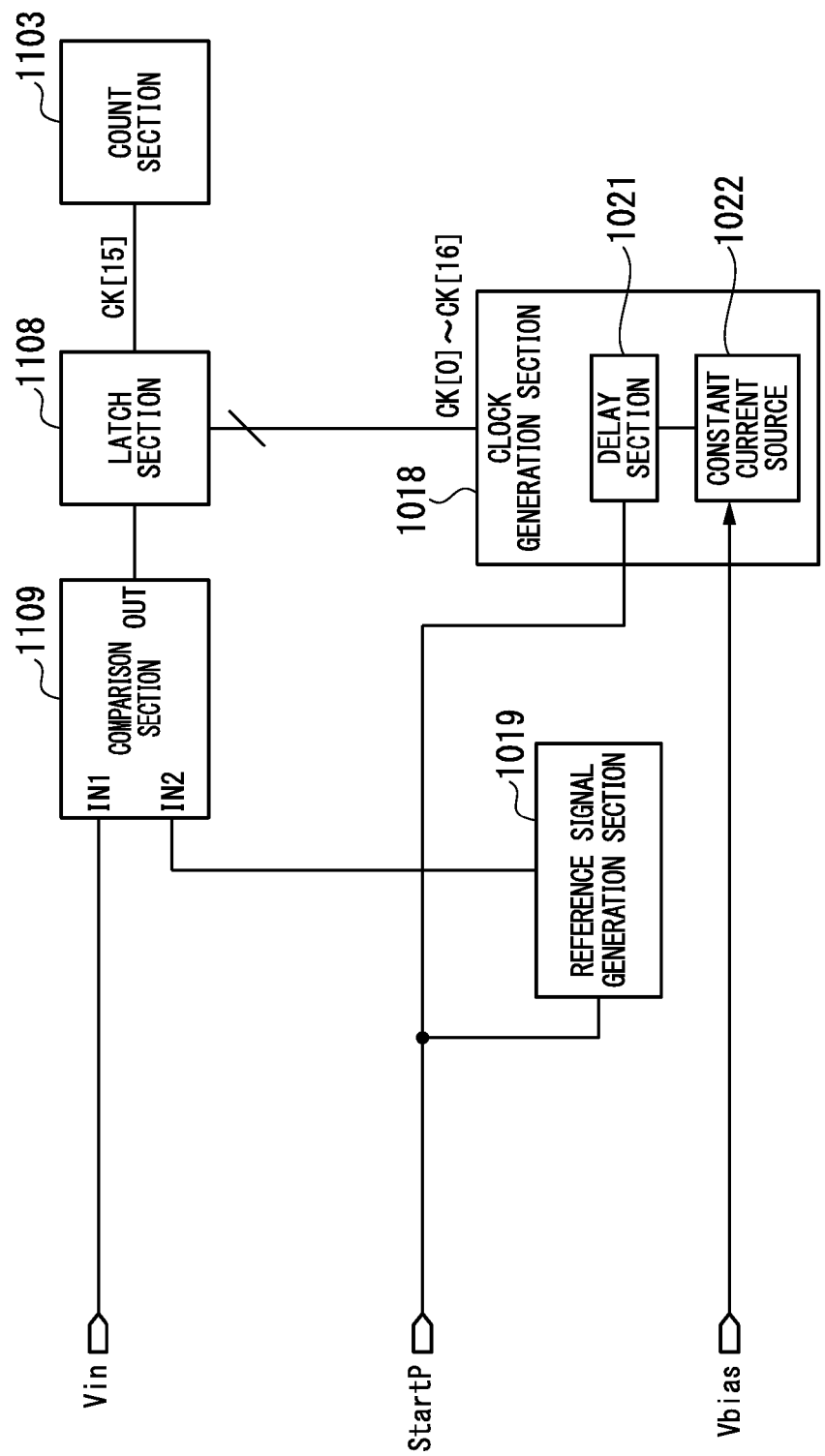
FIG. 7 is a block diagram showing an example of a configuration of a time-to-digital converter Single Slope (tdcSS)-type analog-to-digital converter (ADC) circuit pertaining to an existing example.

Next a second embodiment of the present invention is described, FIG. 6 shows an example of a configuration of an image-capturing device pertaining to the embodiment. An image-capturing device 1 shown in FIG. 6 has an image-capturing section 2, a readout current source section 5, an analog section 6, a vertical selection section 12, a horizontal selection section 14, an ADC group 15, an output section 17, a clock generation section 18, a reference signal generation section 19, and a control section 20.

The image-capturing section 2 includes a photodiode (a photoelectric conversion element) and an in-pixel amplifier, and section pixels 3 which output pixel signals in accordance with the amount of incident light are arranged in a matrix form. The control section 20 is a control circuit for reading out pixel signals from the image-capturing section 2 and performing A/D conversion on the pixel signals. The vertical selection section 12 controls row addressing or row scanning of the image-capturing section 2 through row control lines 11. The horizontal selection section 14 controls column addresses or column scanning of the ADC group 15. The readout current source section 5 is a current source for reading out pixel signals from the image-capturing section 2 as voltage signals. The analog section 6 performs amplification and the like when necessary.

The reference signal generation section 19 generates a ramp wave which is a reference signal whose voltage value increases or decreases over time. The clock generation section 18 has a voltage controlled oscillator (VCO) 100, and generates a clock signal based on a start pulse supplied by the control section 20.

The ADC group 15 has an n-bit digital signal conversion function (n is a natural number equal to or larger than two), and has column ADC sections 16 provided in respective vertical signal lines 13 corresponding to respective pixel columns. Together with the reference signal generation section 19 and the clock generation section 18, the column ADC sections 16 constitute an A/D conversion means (A/D conversion circuit) which converts analog pixel signals read out from section pixels 3 of a selected pixel row in the image-capturing section 2 into digital data.

The column ADC sections 16 have comparison sections 109, latch sections 108, count sections 103, and memory sections 104. The comparison sections 109 compare the ramp wave from the reference signal generation section 19 with analog signals obtained from section pixels 3 in the respective row control lines 11 through the respective vertical signal lines 13. The latch sections 108 have latch circuits which latch (hold/store) the logic state of a lower phase signal composed of a plurality of clock signals output from the clock generation section 18. The count sections 103 counts one of the clock signals constituting the lower phase signal as a count clock. Times in which the comparison sections 109 compare the ramp wave with the analog signals are times in accordance with voltage values of the pixel signals, and results of measuring these times are obtained as data of the lower phase signal latched by the latch sections 108 and resultant data of the counts performed by the count sections 103.

Data latched in the latch sections 108 and the count sections 103 is transmitted to the memory sections 104. The memory sections 104 are connected to a horizontal transmission line. The output section 17 includes a sense amplifier circuit, performs binarization and subtraction on the data output to the horizontal transmission line, and outputs the data of final A/D conversion results to the outside of the image-capturing device 1.

Next, the operation of the image-capturing device 1 is described. As analog pixel signals, reset levels including noise of pixel signals are read out from respective section pixels 3 of a selected row in the image-capturing section 2 by a first-time readout operation, and then signal levels are read out by a second-time readout operation. The reset levels and the signal levels are input to the ADC group 15 through the vertical signal hues 13 in order of time.

After first-time readout from the section pixels 3 of an arbitrary row to the vertical signal lines 13 is settled, a ramp wave obtained by temporally changing a reference voltage is generated by the reference signal generation section 19 and input to the comparison sections 109. The comparison sections 109 perform voltage comparisons between the ramp wave and analog signals of the vertical signal lines 13. in parallel with the input of the ramp wave to the comparison sections 109, a first count is performed by the count sections 103.

When a voltage magnitude relation between the ramp wave and the analog signals of the vertical signal lines 13 is inverted, outputs of the comparison sections 109 are inverted, and simultaneously, data in accordance with time periods in which the comparison sections 109 have performed the comparisons are latched in the latch sections 108 and the count sections 103. At this first-time readout time, unevenness in reset levels of section pixels 3 is generally small, and a reset voltage is common to all pixels. Therefore, the voltage of an analog signal output to an arbitrary vertical signal line 13 is approximately equal to a known value. Accordingly, at the first-time readout time of reset levels, it is possible to reduce a comparison time period by appropriately adjusting the voltage of the ramp wave. The data latched in the latch sections 108 and the count sections 103 is transmitted to the memory sections 104.

At a second-time readout time, signal levels in accordance with the amounts of incident light of respective section pixels 3 are read out in addition to reset levels, and the same operation as the first-time readout is performed. In other words, after the second-time readout from the section pixels 3 of the arbitrary row to the vertical signal lines 13 is settled, a ramp wave is generated by the reference signal generation section 19 and input to the comparison sections 109. The comparison sections 109 perform voltage comparisons between the ramp wave and analog signals of the vertical signal lines 13. In parallel with the input of the ramp wave to the comparison sections 109, a second count is performed by the count sections 103.

When a voltage magnitude relation between the ramp wave and the analog signals of the vertical signal lines 13 is inverted, outputs of the comparison sections 109 are inverted, and simultaneously, data in accordance with time periods in which the comparison sections 109 have performed the comparisons are latched in the latch sections 108 and the count sections 103. The data latched in the latch sections 108 and the count sections 103 is transmitted to the memory sections 104.

After the two times of readout end, first-time and second-time data held in the memory sections 104 is detected in (the sense amplifier circuit of) the output section 17 through a horizontal transmission line by the horizontal selection section 14. Subsequently, in the output section 17, data latched in the latch sections 108 is binarized, data obtained by the first-time readout is subtracted from data obtained by the second-time readout, and then resultant data is output to the outside. After that, the same operation is repeated for every row, and a two-dimensional (2D) image is generated. The binarization and the subtraction may be performed in the column ADC sections 16.

In the image-capturing device 1 of this embodiment, for example, by applying the A/D conversion circuit pertaining to the first embodiment it is possible to synchronize a change of a ramp wave and the operation of the VCO 100. Due to this, it is possible to suppress unevenness in A/D conversion results and an increase in a chip area.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to he considered as being limited by the foregoing description, and is only limited by the scope of the appended claims.

Respective aspects of the present invention can be widely applied to analog-to-digital (A/D) conversion circuits and image-capturing devices having an A/D conversion circuit, and make it possible to suppress unevenness in A/D conversion results and an increase in a chip area.

What is claimed is:

1. An analog-to-digital (A/D) conversion circuit comprising:
  a reference signal generation section that includes an integrator circuit having a capacitor and a first constant current source, and generates a reference signal that changes in accordance with a constant current output by the first constant current source;
  a comparison section that executes a comparison process between an analog signal that is a target of A/D conversion and the reference signal and terminates the comparison process at a timing when the reference signal satisfies a predetermined condition with respect to the analog signal;
  a clock generation section that includes a delay section having a plurality of delay units for delaying an input signal for a predetermined time and outputting delayed input signals in accordance with a constant current output by a second constant current source, and outputs a lower phase signal based on the signals output from the plurality of delay units;
  a latch section that latches the lower phase signal at a timing related to the termination of the comparison process; and
  a count section that counts a clock based on the lower phase signal,
  wherein, when m and n are positive real numbers,
  the first constant current source outputs the current m times a unit current output by a unit current source in accordance with a bias voltage,
  the second constant current source outputs the current n times the unit current, and
  the A/D conversion circuit outputs digital data corresponding to the analog signal, based on the lower phase signal latched by the latch section and a count result of the count section.

2. The A/D conversion circuit according to claim 1, wherein the unit current source includes a transistor having a gate to which the bias voltage is applied.

3. An image-capturing device comprising;
  an image-capturing section that includes a photoelectric conversion element, and in which a plurality of pixels for outputting pixel signals are arranged in a matrix form; and
  the analog-to-digital (A/D) conversion circuit according to claim 1 to which analog signals in accordance with the pixel signals are input.

4. An image-capturing device comprising;
  an image-capturing section that includes a photoelectric conversion element, and in which a plurality of pixels for outputting pixel signals are arranged in a matrix form; and
  the analog-to-digital (A/D) conversion circuit according to claim 2 to which analog signals in accordance with the pixel signals are input.

* * * * *